(12) United States Patent
Lofland

(10) Patent No.: US 6,483,702 B1
(45) Date of Patent: Nov. 19, 2002

(54) APPARATUS AND METHODS FOR ATTACHING THERMAL SPREADER PLATE TO AN ELECTRONIC CARD

(75) Inventor: Steven Lofland, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/225,417

(22) Filed: Jan. 5, 1999

Related U.S. Application Data

(63) Continuation-in-part of application No. 08/992,617, filed on Dec. 17, 1997, now Pat. No. 5,966,287.

(51) Int. Cl.$^7$ ................................................ H05K 7/20
(52) U.S. Cl. .................... 361/704; 361/710; 361/715; 361/690; 361/719; 361/752
(58) Field of Search .............................. 361/690, 704, 361/707, 737, 709–710, 715, 752–753, 719–721, 748

(56) References Cited

U.S. PATENT DOCUMENTS

| | | | | |
|---|---|---|---|---|
| 4,646,203 A | * | 2/1987 | Ngo et al. ................ | 361/707 |
| 5,109,318 A | | 4/1992 | Funari et al. ............. | 361/388 |
| 5,414,592 A | * | 5/1995 | Stout et al. ............... | 361/704 |
| 5,473,511 A | | 12/1995 | Reddy et al. ............. | 361/719 |
| 5,671,122 A | * | 9/1997 | Schoetti et al. .......... | 361/715 |
| 5,883,782 A | | 3/1999 | Thurston et al. | |
| 5,894,408 A | | 4/1999 | Stark et al. | |
| 5,903,436 A | | 5/1999 | Brownell et al. | |
| 5,933,323 A | | 8/1999 | Bhatia et al. | |
| 5,949,647 A | | 9/1999 | Kolman et al. | |
| 5,965,937 A | | 10/1999 | Chiu et al. | |
| 5,966,287 A | | 10/1999 | Loftland et al. | |
| 5,969,944 A | | 10/1999 | Borkar et al. | |
| 5,973,399 A | | 10/1999 | Stark et al. | |
| 5,978,228 A | | 11/1999 | Borker et al. | |
| 5,990,549 A | | 11/1999 | Chiu et al. | |
| 5,990,552 A | | 11/1999 | Xie et al. | |
| 6,008,988 A | | 12/1999 | Palmer | |
| 6,043,984 A | | 3/2000 | Tseng | |
| 6,046,905 A | | 4/2000 | Nelson et al. | |
| 6,046,906 A | | 4/2000 | Tseng | |
| 6,608,051 | | 5/2000 | Wendt | |

* cited by examiner

Primary Examiner—Gregory Thompson
(74) Attorney, Agent, or Firm—Blakely, Sokoloff, Taylor & Zafman LLP

(57) ABSTRACT

An electronic card that includes an integrated circuit which is coupled to a substrate. The substrate is located between two thermally conductive covers. The assembly may further include a fastener that attaches the covers. Alternatively, the covers may be crimped or welded together. As another alternative embodiment the covers may be bonded to integrated circuit located on opposite sides of the substrate.

30 Claims, 2 Drawing Sheets

APPARATUS AND METHODS FOR ATTACHING THERMAL SPREADER PLATE TO AN ELECTRONIC CARD

CROSS REFERENCE TO RELATED APPLICATION

This U.S. patent application filed by inventor Steven Lofland claims the benefit and is a continuation-in-part of U.S. patent application Ser. No. 08/992,617, filed by inventors Lofland et al on Dec. 17, 1997, now issued as U.S. Pat. No. 5,966,287.

BACKGROUND OF THE INVENTION

1. Field of the Invention

The present invention relates to an electronic card.

2. Background Information

Integrated circuits are typically assembled into packages that are mounted to a printed circuit board. By way of example memory devices are commonly assembled into packages that are soldered to a single printed circuit board. One edge of the printed circuit board may have a plurality of contact pads that can be plugged into a connector that is mounted to a motherboard of a computer. The packages and circuit board provide a memory card that can be easily installed and detached from the computer.

The integrated circuits generate heat which must be removed from the packages to insure that the junction temperatures of the circuits do not exceed specified values. Memory cards are typically plugged into computer system which contain a fan that generates a flow of air. The air flows across the memory cards and removes heat from the packages by forced convection.

Inducing a flow of air across the packages may be insufficient to remove heat from integrated circuits that generate a relatively large amount of power. Heat slugs, heat spreaders, heat sinks and heat pipes have all been incorporated into various electronic assemblies to increase the heat transfer rate from the package to the air. These thermal components add cost to the overall assembly. It is desirable to minimize the cost of mass producing a memory card. It would therefore be desirable to provide a thermal element(s) that can be assembled into an electronic card in a cost effective manner.

SUMMARY OF THE INVENTION

One embodiment of the present invention is an electronic card that includes an integrated circuit which is coupled to a substrate. The substrate is located between two thermally conductive covers. The assembly may further include a fastener that attaches the covers.

DETAILED DESCRIPTION

Figure 1:
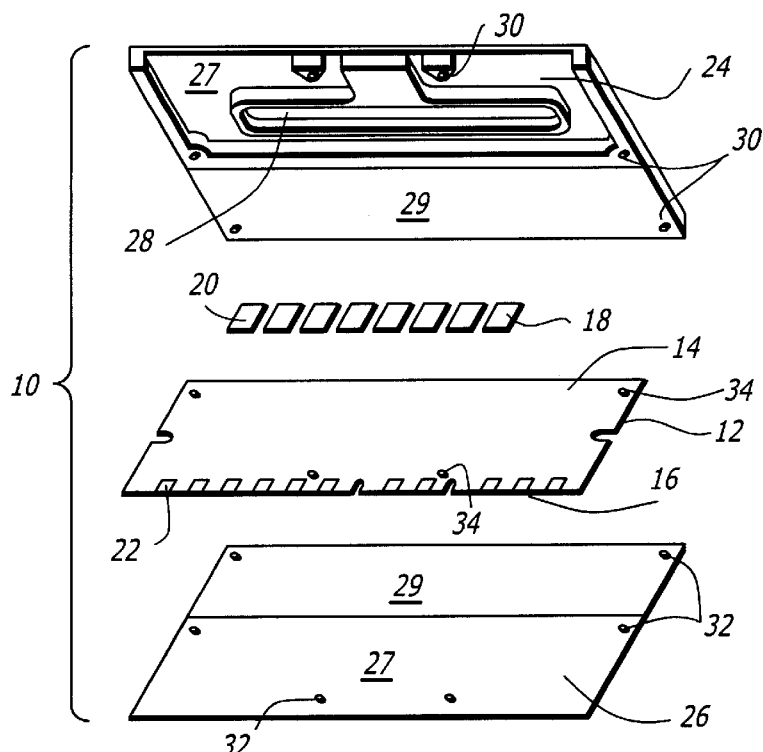
FIG. 1 is an exploded view of an embodiment of an electronic card of the present invention.

Referring to the drawings more particularly by reference numbers, FIG. 1 shows an embodiment of an electronic card 10 of the present invention. The card 10 may include a substrate 12 which has a first side 14 and a second side 16. One or more integrated circuit packages 18 may be mounted to each side 14 and 16 of the substrate 12. Each package 18 may contain one or more integrated circuits 20. By way of example the integrated circuits 20 may be dynamic random access memory (DRAM) devices.

The card substrate 12 may be a printed circuit board which has surface pads, routing traces, power/ground planes, etc. (not shown) that interconnect the integrated circuits 20 to each other and to a plurality of contact pads 22 which extend along one edge of the substrate 12. The contact pads 22 may be plugged into a connector (not shown) that is mounted to a motherboard (not shown) of a computer (not shown).

The integrated circuits 20 generate heat which must be removed from the packages 18. To facilitate the removal of heat the card 10 may include a first thermally conductive cover 24 located on the first side 14 of the substrate 12 and a second thermally conductive cover 26 that is located on the second side 16 of the substrate 12. The covers 24 and 26 are thermally coupled to the packages 18 so that heat flows from the integrated circuits 20 and into the covers 24 and 26. The first 24 and second 26 covers may be thermally coupled to the integrated circuit packages 18 by placing the covers 24 and 26 into direct contact with the outer top surfaces of the packages 18. The first 24 and second 26 covers are preferably constructed from a thermally conductive material such as aluminum or copper so that the heat flows throughout the covers 24 and 26. The covers 24 and 26 provide a large surface area for the heat to transfer into the ambient either by forced or natural convection. The covers 24 and 26 may also be referred to as thermal spreader plates. Each of the covers 24 and 26 have a heat spread area 27 and a heat sink area 29. The heat spread area 27 matches the area of the card substrate 12. The heat sink area 29 enlarges the surface area of heat spread area 27.

Figure 2:
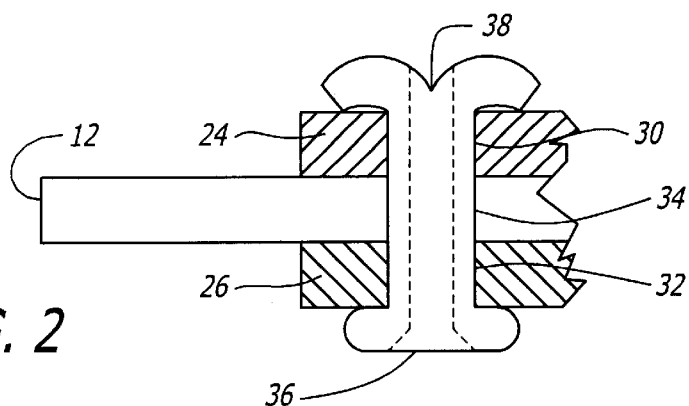
FIG. 2 is an enlarged sectional view showing a rivet that attaches a first cover to a second cover of the card.
Figure 3:
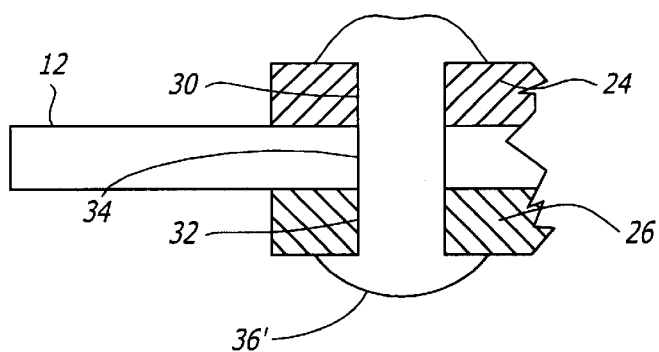
FIG. 3 is an enlarged sectional view showing an alternate embodiment of a card with a staked rivet that attaches a first cover to a second cover.

As shown in FIG. 2 the card 10 may include a rivet fastener 36 which extends through the openings 30, 32 and 34 to attach the first cover 24 to the second cover 26. The rivet 36 shown in FIG. 2 may be swaged onto the first cover 24. The rivet 36 may be solid or have an inner channel 38. FIG. 3 shows a solid rivet 36' that is heat staked into the openings 30, 32 and 34.

Figure 4:
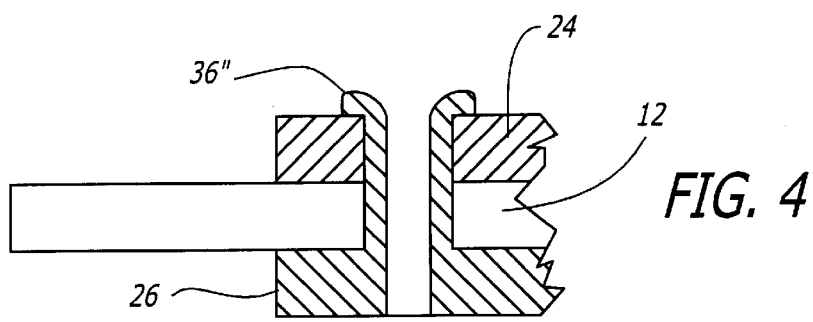
FIG. 4 is an enlarged sectional view showing an alternate embodiment of a card with an extruded rivet that attaches a first cover to a second cover.

FIG. 4 shows an embodiment wherein the rivet 36" is extruded from the second cover 26 and attached to the first cover 24. Extruding the rivet 36" from the cover 26 reduces the number of parts required for inventory and assembly of mass produced cards 10. Although a rivet 36" extruded from the second cover 26 is shown and described, it is to be understood that the rivet 36" could alternatively be extruded from the first cover 24.

Figure 5:
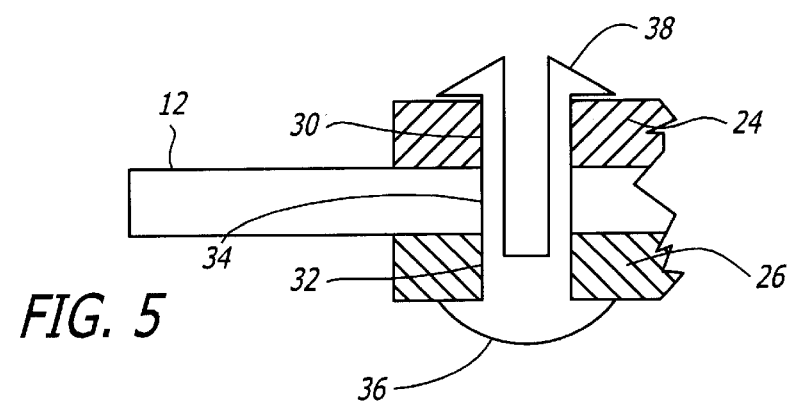
FIG. 5 is an enlarged sectional view showing an alternate embodiment of a card with a snap fastener that attaches a first cover to a second cover.

FIG. 5 shows an alternate embodiment wherein a plastic snap-in fastener 38 is inserted through the openings 30, 32 and 34 to attach the first cover 24 to the second cover 26.

Figure 6:
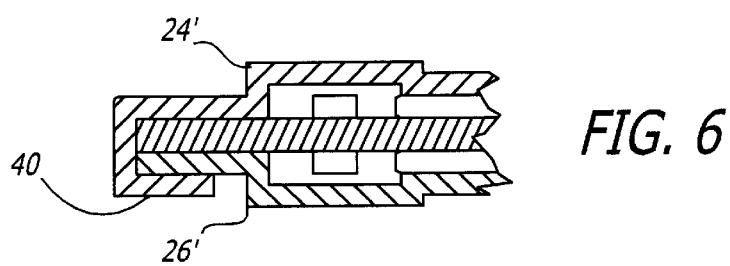
FIG. 6 is an enlarged sectional view showing an alternate embodiment of a card which has a first cover that is crimped onto a second cover.

FIG. 6 shows another embodiment wherein a first cover 24' has a lip 40 that is crimped onto the second cover 26'.

Figure 7:
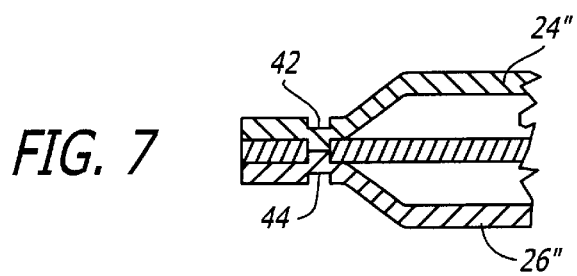
FIG. 7 is an enlarged sectional view showing an alternate embodiment of a card that has a first cover welded to a second cover.
Figure 8:
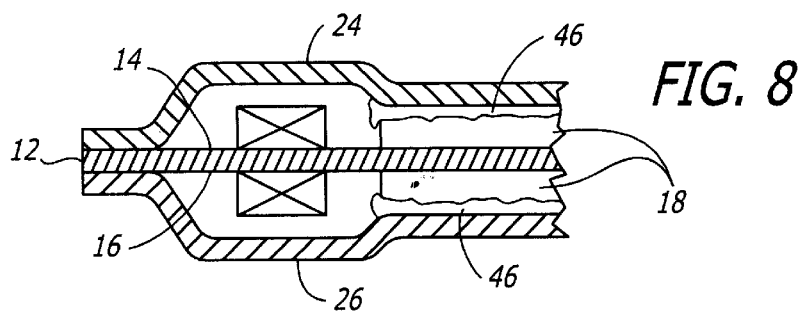
FIG. 8 is an enlarged sectional view showing an alternate embodiment of a card with a pair of covers bonded to integrated circuit packages that are mounted to a substrate.

FIG. 7 shows an embodiment of a card with covers 24" and 26" which have dimpled portions 42 and 44, respectively, that are welded together. FIG. 8 shows yet another embodiment of a card wherein the first cover 24 is bonded to one or more first integrated circuit packages 18 located on the first side 14 of the substrate 12 and the second cover 26 is bonded to one or more integrated circuit packages 18 located on the second side 16 of the substrate 12. The covers 24 and 26 may be bonded to the integrated circuit packages 18 by a thermally conductive epoxy 46.

The covers 24 and 26 and various fastening means provide thermal elements which can be readily assembled in a mass production process at a relatively inexpensive cost.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. Although integrated circuit packages are shown and described, it is to be understood that the integrated circuits may be directly coupled to the substrate 12 and/or the cover(s) 24 and/or 26.

What is claimed is:

1. An electronic card, comprising:
    a substrate that has a first side and a second side and a contact pad;
    an integrated circuit coupled to said first side of said substrate;
    a first thermally conductive cover that is thermally and directly coupled to said integrated circuit, the first conductive cover including a heat spreader area and a distinct heat sink area, the heat spreader area including a recessed portion which conforms to the profile of the integrated circuit:
    a second thermally conductive cover that is adjacent to said second side of said substrate; and,
    a fastener that attaches said first thermally conductive cover to said second thermally conductive cover.

2. The card of claim 1, wherein said fastener is a rivet.

3. The card of claim 2, wherein said rivet has an inner channel.

4. The card of claim 2, wherein said rivet extends from said first thermally conductive cover.

5. The card of claim 1, wherein said fastener is snapped into said first thermally conductive cover.

6. The card of claim 2, wherein said rivet is staked onto said first thermally conductive cover.

7. The electronic card of claim 1, wherein the faster that attaches the first thermally conductive cover to the second thermally conductive cover is a crimp.

8. The card of claim 1, wherein an edge of said substrate has a plurality of contact pads.

9. The electronic card of claim 1, wherein the faster that attaches the first thermally conductive cover to the second thermally conductive cover is a weld.

10. An electronic card, comprising:
    a substrate that has a first side and a second side;
    a first integrated circuit package mounted to said first side of said substrate;
    a second integrated circuit package mounted to said second side of said substrate;
    a first thermally conductive cover that is directly bonded to said first integrated circuit package, the first conductive cover including a heat spreader area and a distinct heat sink area, the heat spreader area including a recessed portion which conforms to the profile of the integrated circuit package; and,
    a second thermally conductive cover that is directly bonded to said second integrated circuit package.

11. The card of claim 10, wherein an edge of said substrate has a pluraity of contact pads.

12. The electronic card of claim 10, wherein a thermally conductive epoxy bonds the first thermally conductive cover to the first integrated circuit package and the second thermally conductive cover to the second integrated circuit package.

13. The electronic card of claim 10, wherein said second thermally conductive cover has a second recessed portion which conforms to the profile of the second integrated circuit.

14. A method for assembling an electronic card, comprising:
    placing a first thermally conductive cover directly in contact with an integrated circuit that is coupled to a first side of a substrate, wherein the first conductive cover includes a heat spreader area and a distinct heat sink area, the heat spreader area includes a recessed portion which conforms to the profile of the integrated circuit package and wherein the substrate has a second side;
    placing a second thermally conductive cover adjacent to the second side of the substrate; and,
    fastening the second thermally conductive cover to the first thermally conductive cover.

15. The method of claim 14, wherein the fastening of the second thermally conductive cover to the first thermally conductive cover is by riveting.

16. The method of claim 14, wherein the fastening of the second thermally conductive cover to the first thermally conductive cover is by crimping.

17. The method of claim 14, wherein the fastening of the second thermally conductive cover to the first thermally conductive cover is by welding.

18. The method of claim 14, wherein the fastening of the second thermally conductive cover to the first thermally conductive cover is by bonding.

19. The method of claim 14, wherein the fastening of the second thermally conductive cover to the first thermally conductive cover is by snapping a snap fastener in place.

20. The method of claim 14, wherein the first thermally conductive cover and the second thermally conductive cover are metal.

21. The method of claim 15, wherein a rivet used in riveting the second thermally conductive cover to the first thermally conductive cover has an inner channel.

22. A method for assembling an electronic card, comprising:
    bonding a first thermally conductive cover directly onto a first integrated circuit package that is mounted to a first side of a substrate, wherein the first conductive cover includes a heat spreader area and a distinct heat sink area, the heat spreader area includes a recessed portion which conforms to the profile of the integrated circuit package; and,
    bonding a second thermally conductive cover directly onto a second integrated circuit package that is mounted to a second side of the substrate.

23. The method of claim 22, wherein a thermally conductive epoxy is used in the bonding of the first thermally conductive cover to the first integrated circuit package and the bonding of the second thermally conductive cover to the second integrated circuit package.

24. The method of claim 22, wherein the second thermally conductive cover has a second recessed portion which conforms to the profile of the second integrated circuit package.

25. An electronic card, comprising:
- a printed circuit board having a first side, a second side, and a contact pad;
- a first integrated circuit coupled to the first side of the printed circuit board and a second integrated circuit coupled to the second side of the printed circuit board;
- a first thermally conductive cover thermally and directly coupled to the first integrated circuit, the first conductive cover including a heat spreader area and a distinct heat sink area, the heat spreader area including a recessed portion which conforms to the profile of the integrated circuit;
- a second thermally conductive cover thermally coupled to the second integrated circuit; and,
- a means for coupling the first thermally conductive cover and the second thermally conductive cover together.

26. The electronic card of claim 25, wherein the means for coupling the first thermally conductive cover and the second thermally conductive cover together is a rivet.

27. The electronic card of claim 25, wherein the means for coupling the first thermally conductive cover and the second thermally conductive cover together is a weld.

28. The electronic card of claim 25, wherein the means for coupling the first thermally conductive cover and the second thermally conductive cover together is a crimp.

29. The electronic card of claim 25, wherein the means for coupling the first thermally conductive cover and the second thermally conductive cover together is a fastener.

30. The electronic card of claim 25, wherein the second thermally conductive cover has a second recessed portion which conforms to the profile of the second integrated circuit.

* * * * *